United States Patent
Sahu

(10) Patent No.: US 6,657,483 B1
(45) Date of Patent: Dec. 2, 2003

(54) ADJUSTING THE TRANS-CONDUCTANCE OF A FILTER

(75) Inventor: Debapriya Sahu, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/302,998

(22) Filed: Nov. 25, 2002

(51) Int. Cl.⁷ .................................................. H03K 5/00
(52) U.S. Cl. ...................................... 327/553; 327/552
(58) Field of Search ................................ 327/552, 553, 327/554; 330/303, 305

(56) References Cited

U.S. PATENT DOCUMENTS 5,650,950 A * 7/1997 Siniscalchi et al. ......... 364/607
6,172,569 B1 * 1/2001 McCall et al. .............. 330/303

OTHER PUBLICATIONS

Francois Krummenacher and Norbert Joehl, "A 4–MHz CMOS Continuous–Time Filter with On–Chip Automatic Tuning", IEEE Journal of Solid State Circuits, vol. 23, No. 3, Jun. 1988, pp. 750–758.
Chin S. Park and Rolf Schaumann, "Design of a 4MHz Analog Integrated CMOS Transconductance –C Bandpass Filter", IEEE Journal of Solid State Circuits, vol. 23, No. 4, Aug. 1988, pp. 987–996.
J. Silva Martinez, Michiel Steyaert and Willy Sansen, A Novel Approach for the Automatic Tuning of Continuous Time Filters, IEEE Intenational Symposium in Circuits and Systems, 1991, pp. 1452–1455.
Un–Ku Moon and Bang– Sup Song, "Design of a Low–Distortion 22 kHz Fifth–Order Bessel Filter", IEEE Journal of Solid State Circuits, vol. 28,No. 12, Dec. 1993, pp. 1254–1264.
Un–Ku Moon and Bang– Sup Song, "A Low–Distortion 22 kHz 5th–Order Bessel Filter", IEEE International Solid– State Circuits Conference 1993, pp. 110–111, 271.
Srinivasan Venkatraman, Srikanth Natarajan, K. Radhakrishna Rao, "A New Tuning Scheme for Continuous Time Filters", 1063–9667/97, 1997 IEEE, pp. 150–154.
Scott T. Dupuie and Mohammen Ismail, High Frequency CMOS Transconductors, Book title:"Analogue IC design : The current mode Approach"—by C. Toumazou, Chapter 5, pp. 181–231, Publisher:Peter Peregrinus Ltd; ISBN number is 0 86341 215 7.

* cited by examiner

*Primary Examiner*—Dinh T. Le
(74) *Attorney, Agent, or Firm*—Frederick J. Telecky, Jr.; W. James Brady, III

(57) ABSTRACT

An analog or continuous tuning loop which generates an analog signal representative of a difference of signals generated by a mirror trans-conductor circuit (having electrical characteristics similar to other such trans-conductor circuits used in a filter) and a reference circuit. The analog signal is used to adjust the trans-conductance such that the current generated by the trans-conductance circuit equals a reference current generated by the reference circuit. A filter using such trans-conductor circuits may be designed to be tuned to a desired cut-off frequency when the desired trans-conductance is achieved. An additional digital circuit generates a few digital bits, which may be used to selectively activate the respective trans-conductor elements contained in the mirror trans-conductor circuit and the filter.

24 Claims, 6 Drawing Sheets

US 6,657,483 B1

ADJUSTING THE TRANS-CONDUCTANCE OF A FILTER

BACKGROUND OF THE INVENTION

1. Field of the Invention

The present invention relates to filters, and more specifically to a method and apparatus for adjusting the trans-conductance of a filter.

2. Related Art

A filter generally refers to a component which allows/passes a range of frequencies and rejects all other frequencies from an input signal. For example, a low pass filter allows all low frequencies below a cut off frequency (determined by filter components) and rejects all the high frequencies above cut off frequency.

Filters are often implemented within integrated circuits, and are thus characterized by trans-conductance. Trans-conductance generally provides a measure of the degree of conductivity of a filter and equals the reciprocal of resistance. Filter characteristics such as frequency response and amplification factor are determined by (among other factors) the trans-conductance value as is well known in the relevant arts.

One problem often encountered with filters is that the actual trans-conductance value is at variance with a desired value. The variance can be for reasons such as imperfections in manufacturing technologies and material, changes in operating conditions (e.g., ambient temperature), etc. Accordingly, it is desirable to adjust the trans-conductance value of a filter during operation.

SUMMARY OF THE INVENTION

A tuning circuit provided according to an aspect of the present invention can be used to tune a component (e.g., filter) to a desired trans-conductance value. The tuning circuit may contain a trans-conductor circuit generating a present signal representing a present trans-conductance of the trans-conductor circuit. The trans-conductance circuit operates to provide a similar transfer function as the component. A reference circuit may generate a reference signal representing the desired trans-conductance value.

An integrating capacitor may receive both the present signal and the reference signal in opposite directions, and be charged to a voltage level representing a difference of the present signal and the reference signal. An amplifier may amplify the voltage level to generate an analog signal. The analog signal may then be used to change the trans-conductance of the trans-conductor circuit and the component.

Due to the operation of the integrating capacitor, the tuning circuit may be implemented using only a single active element (i.e., amplifier). The amplifier can be implemented in an open loop configuration to minimize power consumption. In an embodiment, the amplifier is implemented as a single stage CMOS amplifier.

In an embodiment, the reference signal is generated using a switched capacitor circuit. The tuning circuit may further contain a passive circuit (i.e., containing only passive elements) to eliminate any ripple generated in a voltage signal generated by the switched capacitor circuit.

In an embodiment, the passive circuit contains a first resistor connected in parallel to the integrating capacitor, the first resistor and the integrating capacitor being connected between a first node and a second node. The passive circuit may also contain a second resistor connected between the non-inverting input terminal of the amplifier and the first node. A third resistor may be connected between the inverting input terminal (of the amplifier) and the second node.

More passive components may be provided to eliminate (reduce) any additional ripples present at the output of the amplifier. In an embodiment, a second capacitor, a fifth resistor and a third capacitor may be provided. The second capacitor is connected between the output terminal of the amplifier and a ground, the fifth resistor is connected between the output terminal of the amplifier and a third node, and the third capacitor is connected between the third node and the ground.

In an embodiment, the output of the amplifier may not be stable due to the two poles respectively introduced by the integrating capacitor and the amplifier. Accordingly, the tuning circuit may be provided with a fourth resistor and a first capacitor connected in series between the output terminal and the ground. The fourth resistor and the first capacitor operate to remove the effect of one of the poles by introducing a zero, thereby lending stability to the output signal.

The tune component (e.g., filter) may contain multiple trans-conductor stages. The output of the amplifier may be examined to determine the specific stages to activate and de-activate. A digital bits generator may generate digital bits specifying which ones of the stages to be activated and de-activated.

Further features and advantages of the invention, as well as the structure and operation of various embodiments of the invention, are described in detail below with reference to the accompanying drawings. In the drawings, like reference numbers generally indicate identical, functionally similar, and/or structurally similar elements. The drawing in which an element first appears is indicated by the leftmost digit(s) in the corresponding reference number.

BRIEF DESCRIPTION OF THE DRAWINGS

The present invention will be described with reference to the accompanying drawings, wherein.

DETAILED DESCRIPTION OF THE PREFERRED EMBODIMENTS

1. Overview and Discussion of the Invention

An embodiment according to the present invention contains a tuning circuit implemented with several passive elements and a single active element. The tuning circuit generates an analog signal representing the extent to which the trans-conductance of a filter needs to be adjusted, and the trans-conductance of the filter may be adjusted accordingly. As the tuning circuit is implemented using only a single active element, the total power consumed by an integrated circuit (containing the filter circuit) may be less. The single active element may be implemented as a open-loop amplifier (which may not require high speed performance), further reducing the power consumption requirements.

Several aspects of the invention are described below with reference to examples for illustration. It should be understood that numerous specific details, relationships, and methods are set forth to provide a full understanding of the invention. One skilled in the relevant art, however, will readily recognize that the invention can be practiced without one or more of the specific details, or with other methods, etc. In other instances, well-known structures or operations are not shown in detail to avoid obscuring the invention.

2. Example System

Figure 1:
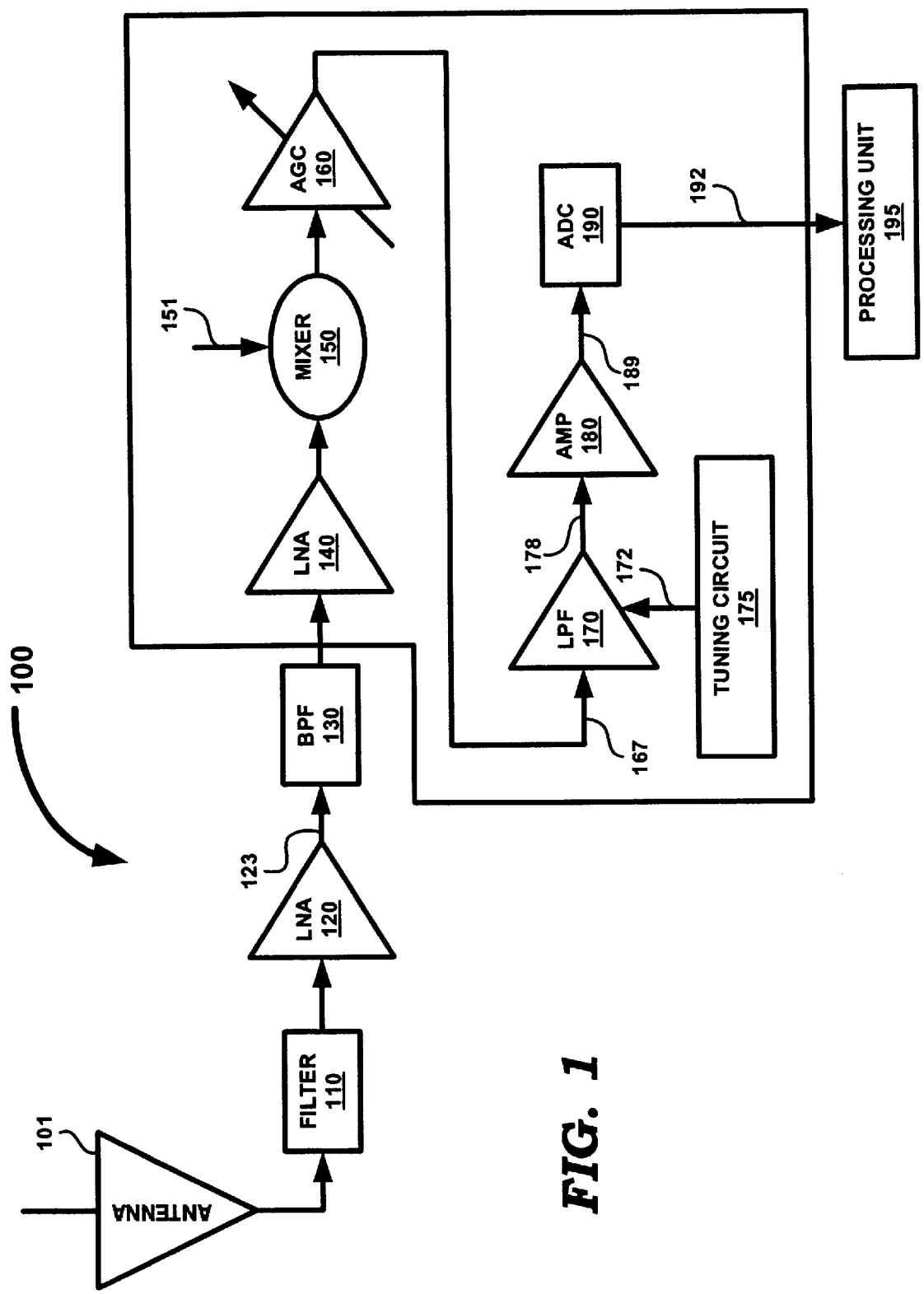
FIG. 1 is a block diagram illustrating the details of an example device in which the present invention may be implemented.

FIG. 1 is a block diagram of receiver system 100 illustrating an example system in which the present invention may be implemented. For illustration, it is assumed that receiver system 100 is implemented within a Global Positioning System Receiver. However, receiver system 100 can be implemented in other devices (e.g., mobile phone, etc.) which generally require low power consumption.

Receiver system 100 is shown containing antenna 101, filter 110, low noise amplifiers (LNA) 120 and 140, band pass filter 130, mixer 150, automatic gain controller 160, filter circuit 170, tuning circuit 175, amplifier 180, analog to digital converter (ADC) 190, and processing unit 195. Each component is described in further detail below.

Antenna 101 may receive various signals transmitted from satellites, etc. The received signals may be provided to filter 110. Filter 110 may perform a corresponding transfer function to generate signals of the frequencies of interest. The generated signals are provided to LNA 120. Antenna 101 and filter 110 may be implemented in a known way.

LNA 120 amplifies the signals received on line 112 to generate a corresponding amplified signal on line 123. Band pass filter (BPF) 130 may filter the amplified signal to remove any unwanted components that may be present. The filtered signal thus generated may be provided to LNA 140. LNA 140 may again amplify the filtered signals and provide the amplified filtered signal to mixer 150. LNAs 120 and 140, and BPF 130 may also be implemented in a known way.

Mixer 150 may be used to convert a high frequency signal to a signal having any desired frequency. In an embodiment, a signal of frequency 1575 MHz is converted to a 4 Mhz signal. Mixer 150 may receive the filtered amplified signal and a signal of fixed frequency as inputs. The signal (on path 151) of fixed frequency may be generated by a phase locked loop (not shown) in a known way.

Automatic gain control (AGC) 160 may be used to amplify or attenuate the signal (from mixer 150) according to various requirements. For example, if a user using a mobile phone is in an area where the signals received are of low strength, and AGC 160 amplifies the signal with a high amplification factor. Similarly, if the user moves to an area where the signal strength is relatively high, AGC 160 may attenuate the signal.

Filter circuit 170 may correspond to a low pass filter which allows low frequencies and rejects all other high frequencies of noise components present in the signal received on line 167. Filter circuit 170 may be implemented with trans-conductors, capacitors, etc. The filtered signal may be provided to amplifier 180 on path 178. An embodiment of filter circuit 170 is described below.

Amplifier 180 amplifies the signal received on line 178 to generate an amplified signal. The amplified signal may be provided to analog to digital converter (ADC) 190 on line 189. ADC 190 converts the analog signal received on line 189 to a corresponding digital value. The digital value may be provided to processing unit 195 on path 192 for further processing.

It may be appreciated that some of the components (for example filter circuit 170) described above are characterized by trans-conductors. One problem with trans-conductors is that trans-conductance value of the trans-conductor may change due to manufacturing technologies, operating conditions, etc. The change in trans-conductance value of trans-conductors in filter circuit 170 may change frequency response of filter circuit 170, and the output generated may not match the desired output to the change in frequency response.

Tuning circuit 175 provided according to an aspect of the present invention generates an analog signal representing the degree to which the trans-conductance of filter circuit 170 needs to be adjusted. The analog signal can be used to adjust/tune the trans-conductance of the filters. The manner in which the analog signal can be generated is described below with reference to FIG. 2.

3. Tuning Circuit

Figure 2:
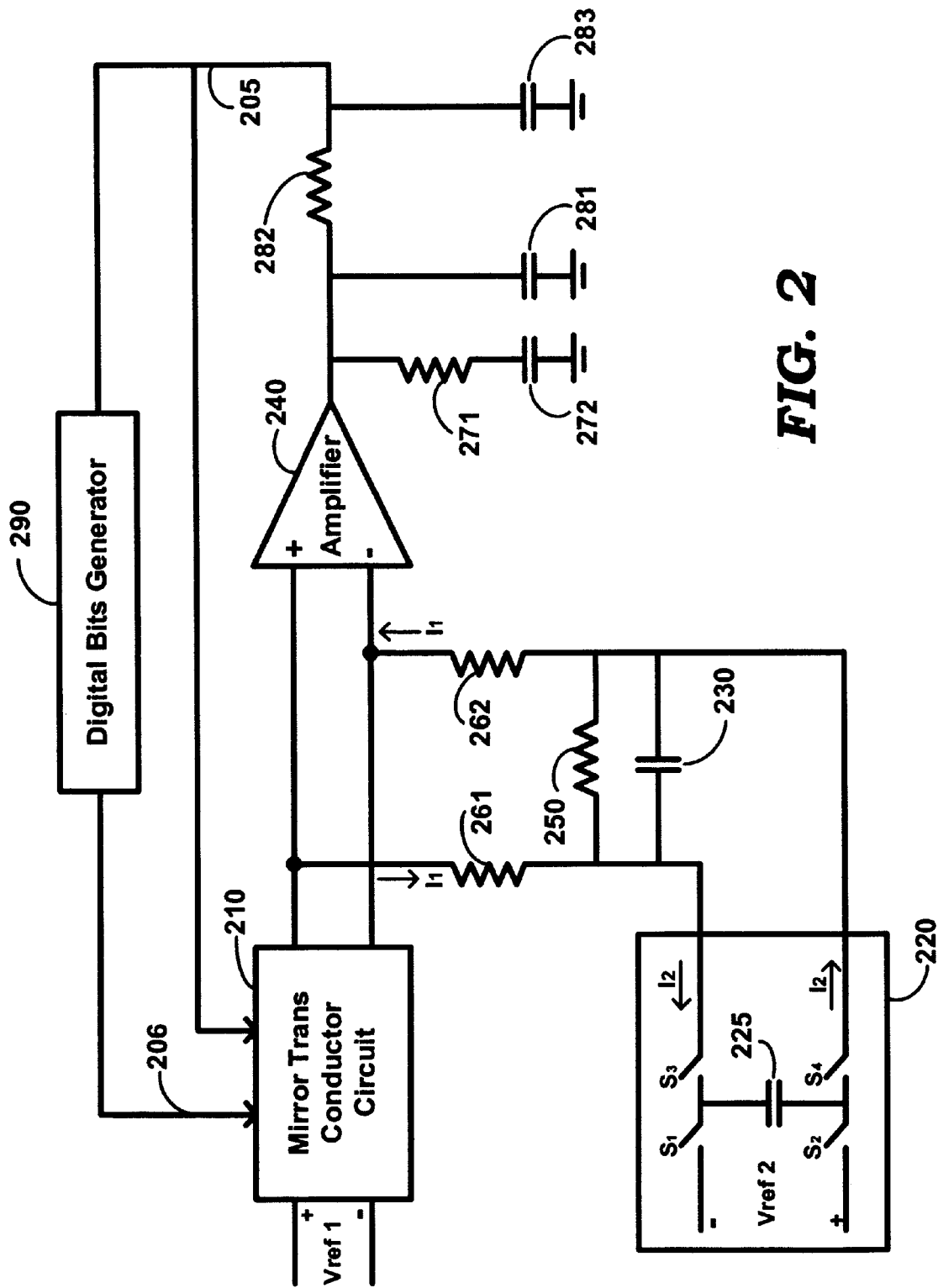
FIG. 2 is a circuit diagram illustrating the details of a tuning circuit in an embodiment of the present invention.

FIG. 2 is a circuit diagram illustrating the details of tuning circuit 175 in one embodiment. Tuning circuit 175 is shown containing mirror trans-conductor circuit 210, switched capacitor circuit 220, amplifier 240, resistors 250, 261, 262, 271 and 282, capacitors 230, 272, 281 and 283, and digital bits generator 290. Each component is described below.

Mirror trans-conductor circuit 210 is implemented with to provide similar transfer function (i.e., transformation operation on an input signal) as filter circuit 170 in the same operating conditions. In an embodiment, mirror trans-conductor circuit 210 is implemented as a replica (i.e., same material, components, etc.) of trans-conductor circuit in filter circuit 170.

Thus, mirror trans-conductor circuit 210 may be designed to adjust the internal trans-conductance value according to a control voltage received on path 205 and digital bit(s) received on path 206. In an embodiment, mirror trans-conductor circuit 210 contains multiple trans-conductor stages, and the bits on path 206 are used to select among the stages. The control voltage is used to fine-tune the trans-conductance within the selected stages. The manner in which the trans-conductance can be adjusted and the digital bits can be generated, will be clearer from the description of the details of low pass filter 170 with reference to FIGS. 4, 5, 6 and 7.

Mirror trans-conductor circuit 210 generates current I1 according to the changed trans-conductance and the voltage level of Vref1. Vref1 may be implemented in the form of constant D.C. voltage. As Vref1 is maintained constant, the current I1 generated by trans-conductance circuit 210 depends on the effective trans-conductance after the change(s) noted in the previous paragraph. The current I1 is provided to integrating capacitor 230.

Switched capacitor circuit 220 generates current I2, which remains stable in various operating conditions. Switched capacitor circuit 220 needs to be implemented to generate current I2 reflecting a desired trans-conductance value of filter circuit 170. In an embodiment, switched capacitor circuit 220 is implemented by using a stable frequency $f_{sam}$ generated by an external crystal (not shown), switches S1, S2, S3 and S4, and capacitor 225 as described below.

As may be appreciated, crystals can be implemented to generate a stable frequency $f_{sam}$, which is independent of temperature changes, or other operating conditions. The frequency is described as containing two phases φ1 and φ2, which respectively control switches S1, S2 and S3, S4. It may be appreciated that switched capacitor circuit 220 represents an example reference circuit which generates a stable (constant) signal in various operating conditions of interest.

Capacitor 225 is implemented with a small capacitance value, and is charged in phase φ1 (when switches S1 and S2 are closed) by voltage Vref2. Due to the small capacitance, capacitor 225 may be charged quickly in phase φ1. In phase φ2, capacitor 225 discharges when switches S1 and S2 are open and switches S3 and S4 are closed. Due to the quick charging and discharging, capacitor 225 may be viewed as generating impulsive current I2, which is provided to integrating capacitor 230. The voltage Vref2 and frequency $f_{sam}$ need to be selected to ensure that the current I2 reflects a reference desired trans-conductance value.

Integrating capacitor 230 is implemented with a large capacitance value, and is charged in phase φ2 by capacitor 225. Integrating capacitor 230 receives currents I1 and I2, which may flow in opposite direction to each other through integrating capacitor 230. Due to the large capacitance value, integrating capacitor 230 charges and discharges slowly, and operates as an integrator of both impulsive current I2 and the current I1. As the two currents are flowing in opposite direction, integrating capacitor 230 provides a difference voltage corresponding to the difference between the two currents I1 and I2.

Amplifier 240 receives the difference voltage present across integrating capacitor 230, amplifies the difference voltage, and provides the amplified difference voltage on path 205. Amplifier 240 can be implemented in a open-loop mode since the difference voltage received as input already integrates the two signals I1 and I2 using passive components. Due to the open loop mode of operation, the power consumption is further reduced since amplifier 240 may not require high bandwidth or speed. In an embodiment, amplifier 240 is implemented as a simple single-stage CMOS amplifier as shown in FIG. 3.

Figure 3:
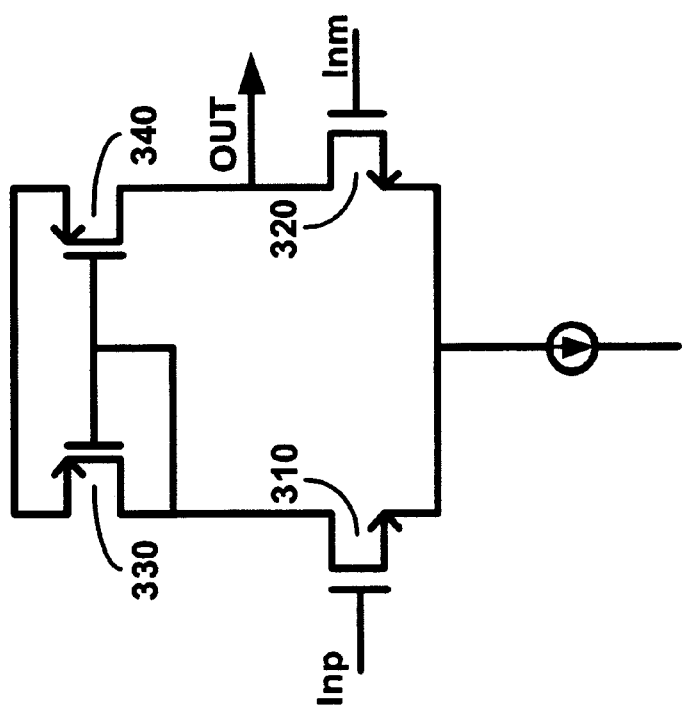
FIG. 3 is a circuit diagram illustrating the details of amplifier in one embodiment of the present invention.

FIG. 3 is shown containing NMOS transistors 310 and 320 respectively receiving INP (corresponds to + terminal of amplifier 240) and INM (− terminal of amplifier 240) signals on the corresponding gate terminals. In combination with PMOS transistors 330 and 340 (shown in FIG. 3), the amplified signal is generated on OUT terminal, as will be apparent to one skilled in the relevant arts.

Continuing with exclusive reference to FIG. 2, resistor 250 maintains the DC biasing at both inputs of amplifier 240 so that amplifier 240 operates in a linear portion. In general, amplifier needs to be operated in linear portion to provide amplification to the input signal. As integrating capacitor 230 allows AC signals to flow through it, resistor 250 provides DC biasing between the two inputs of amplifier 240 to operate in a linear portion.

It may be appreciated that resistor 250 provides a DC link or tie up between the two inputs of amplifier 240. As a result, input difference cannot build up too much, therefore not allowing amplifier 240 to saturate. Otherwise amplifier 240 could go to a saturated non-linear mode, from which it may not recover. The resistor 250 may be designed large enough so that it maintains a large input impedance between the two inputs of the amplifier.

Resistors 261 and 262 attenuate the ripple caused by switched capacitor circuit 220. The ripple may be caused due to the periodic switching of switched capacitor circuit 220. Even though resistor 250 and capacitor 230 provide some filtering to this ripple and generate an average voltage, a substantial amount of ripple may exist at the output of resistor 250 and integrating capacitor 230 combination. Such ripple may be attenuated by resistors 261 and 262 before applying the difference voltage at the two inputs of amplifier 240.

Resistor 271 and capacitor 272 may provide stability to the loop. Integrating capacitor 230 may cause a pole and amplifier 240 also causes a low frequency filtering pole to reduce ripple in the output of amplifier 240. The two poles would make tuning circuit 175 unstable. Therefore, the series combination of resistor 271 and capacitor 272 causes a low frequency zero to cancel the effect of one of the two poles and thus makes tuning circuit 175 stable. Otherwise amplifier 240 could go into oscillatory state, from which it may not recover.

Resistor 282 and capacitors 281 and 283 operate as a filter circuit. The filter circuit of resistor 282 and capacitors 281 and 283 further reduces the ripple in the output of amplifier 240. It may be appreciated that the ripple may be presented to the filter circuit even though resistor 250 and capacitor 230 provide good filtering to this ripple, and the filter circuit operates to reduce the resulting ripple at the output of amplifier 240. The signal thus filtered is provided as control voltage on path 205 to both trans-conductor circuit 210 and digital bits generator 290.

Digital bits generator 290 receives the control voltage and generates digital bits on path 206. Digital bits generator 290 provides more tuning range by selectively activating/deactivating the trans-conductor stages. Digital bits generator 290 may also ensure that the filter circuit 170 operates in a linear region. The manner in which digital bits generator 290 is implemented in an embodiment is described with reference to FIG. 7.

Thus, it may be appreciated that tuning circuit 175 is implemented with passive components (resistors and capacitors) and with a simple active element (amplifier 240), which may consume a small amount of current. Tuning circuit 175 may continuously generate the control voltage and adjust the trans-conductance value to the desired value. The active element may not require high performance, and hence can be designed with reduced power consumption requirements.

As noted above, trans-conductor circuit 210 receives the digital bits, which are used to select among the various trans-conductor stages, and the control voltage is used to fine-tune the trans-conductance within the selected stages. Such an adjustment generally needs to parallel the adjustment of trans-conductance value within low pass filter 170. Accordingly, the manner in which the trans-conductance of low pass filter 170 may be adjusted is described below.

5. Trans-Conductor Circuit Within Filter Circuit

An embodiment of trans-conductor circuit within filter circuit (and in mirror trans-conductor circuit 210 as well) contains multiple trans-conductor stages which are selectively activated by digital bits. The activation (and de-activation) of the stages causes the effective trans-conductance of the trans-conductor circuit to be correspondingly changed in large quantum (step sizes). The control voltage can then be used to fine-tune the trans-conductance.

The details of such an illustrative embodiment and a graph depicting the operation are described below with reference to FIGS. 5 and 6 respectively. However, the operation and advantages may be clearer by appreciating the potential inadequacy in addressing a desired broad operating range by using a single stage in a trans-conductor circuit, as described below with reference to FIG. 4.

Figure 4:
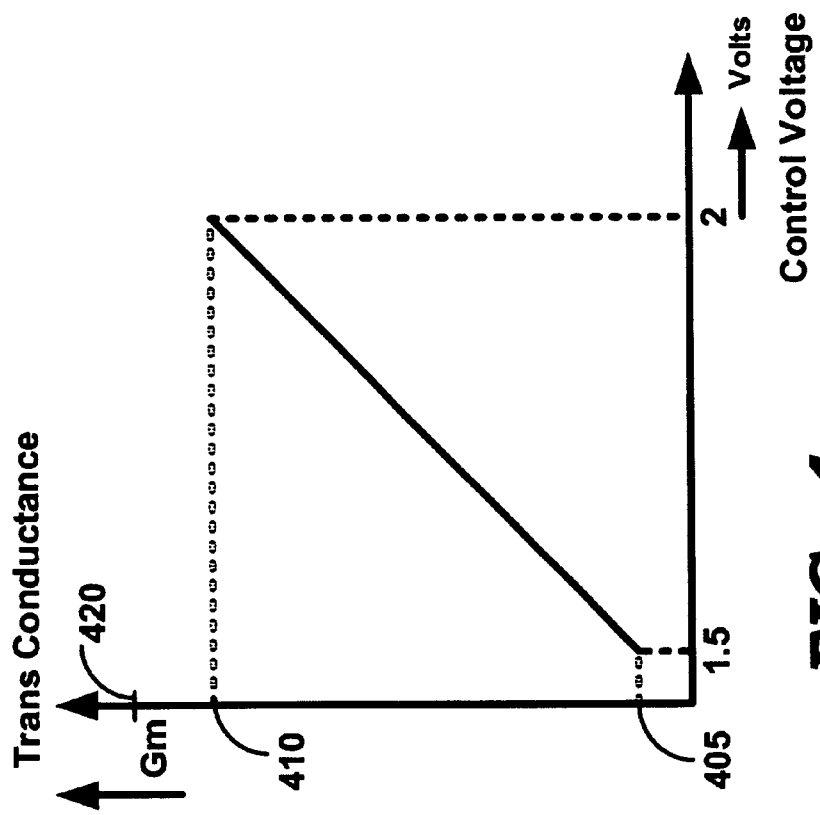
FIG. 4 contains a graph illustrating the details of change in trans-conductance value for a control voltage with a single trans-conductor stage in an embodiment of the present invention.

FIG. 4 is a graph illustrating the details of change in trans-conductance value of a filter circuit when control voltage (X-Axis in volts) is used to tune the trans-conductance (Y-axis in Mhos) of an embodiment of a single trans-conductor stage. The frequency response ($f_{3db}$) of the filter circuit 170 changes with change in trans-conductance value. In general, a desired frequency response ($f_{3db}$) is obtained by adjusting the filter circuit to desired trans-conductance value.

The control voltage generally changes trans-conductance value linearly in steps between upper limit 410 and lower limit 405 as shown in FIG. 4. Assuming that a value 420 is required for the effective trans-conductance, that value may not be obtained using a single trans-conductor stage as the value 420 falls outside of the range 405 through 410. Accordingly, multiple trans-conductor stages may be used within a trans-conductor circuit according to an aspect of the present invention as described below with FIGS. 5 and 6.

Figure 5:
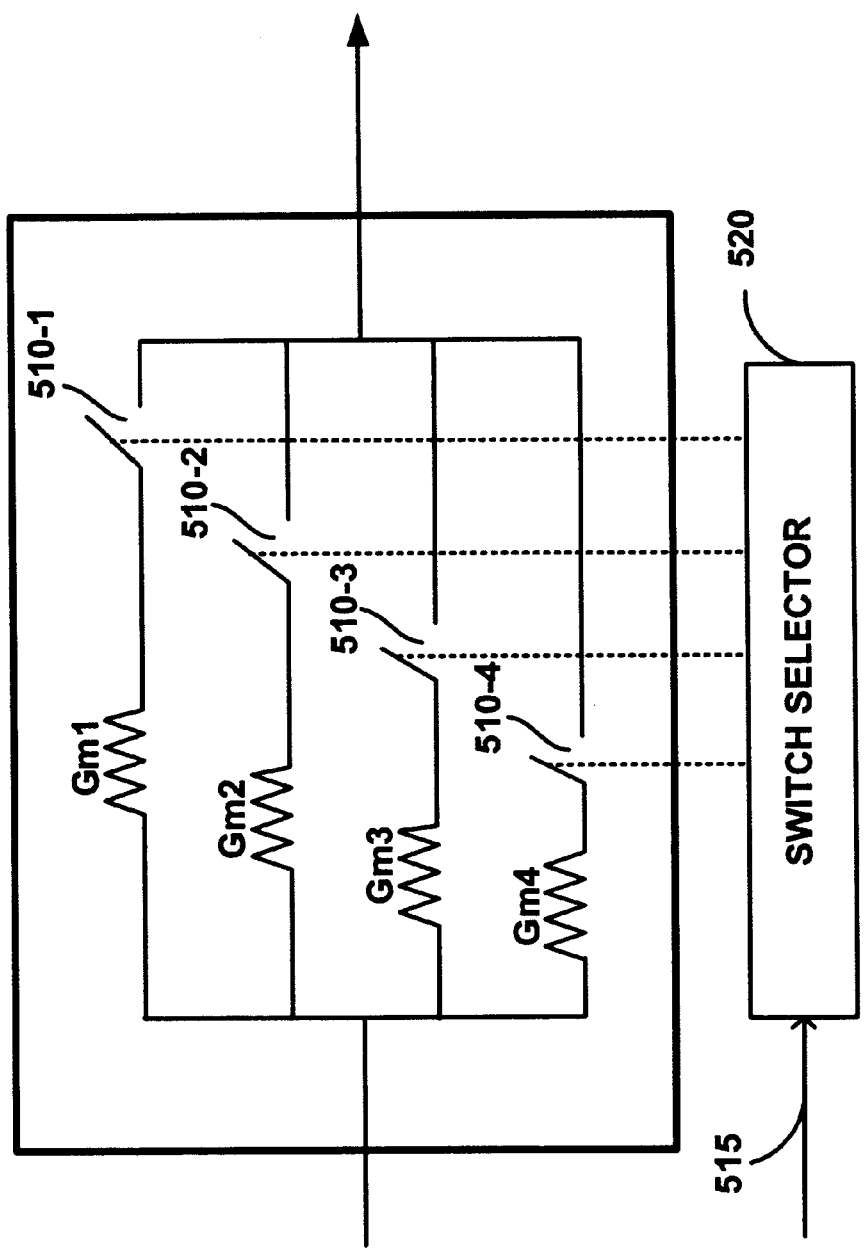
FIG. 5 is a circuit diagram illustrating the details of a trans-conductor circuit with four trans-conductor stages in one embodiment of the present invention.

FIG. 5 is a circuit diagram illustrating the details of trans-conductor circuit within filter circuit 170 in an embodiment of the present invention. The trans-conductor circuit is shown containing four trans-conductor stages (Gm1, Gm2, Gm3, and Gm4), switches 510-1 through 510-4, and switch selector 520. Each component is described below.

Trans-conductor stages Gm1, Gm2, Gm3, and Gm4 are respectively connected in series with switches 510-1 through 510-4. Switches 510-1 through 510-4 are placed in either connected or disconnected status by switch selector 520. Accordingly, any of four trans-conductor stages (Gm1, Gm2, Gm3, and Gm4) can be placed in either connected or disconnected configuration.

Switch selector 520 receives the digital bits on path 515 and may generate control signals to switches 510-1 through 510-4. In an embodiment, only one of the four trans-conductor stages is placed in a connected configuration (and the others in disconnected configuration). In such a situation, the four trans-conductor elements may individually provide different ranges of trans-conductance values, and only one of the stages may be selectively placed in a connected configuration.

However, in alternative embodiments, more trans-conductor stages can be placed in connected configuration at the same time to attain a desired range of trans-conductance values. The specific stages to be placed in connected configuration can again be determined by switch selector 520 based on the digital bits. In a simplistic scenario, each of the four input bits directly controls the respective one of the four switches 510-1 through 510-4. Irrespective of the specific approach chosen, the trans-conductance values of the embodiments may be characterized according to the graph of FIG. 6.

Figure 6:
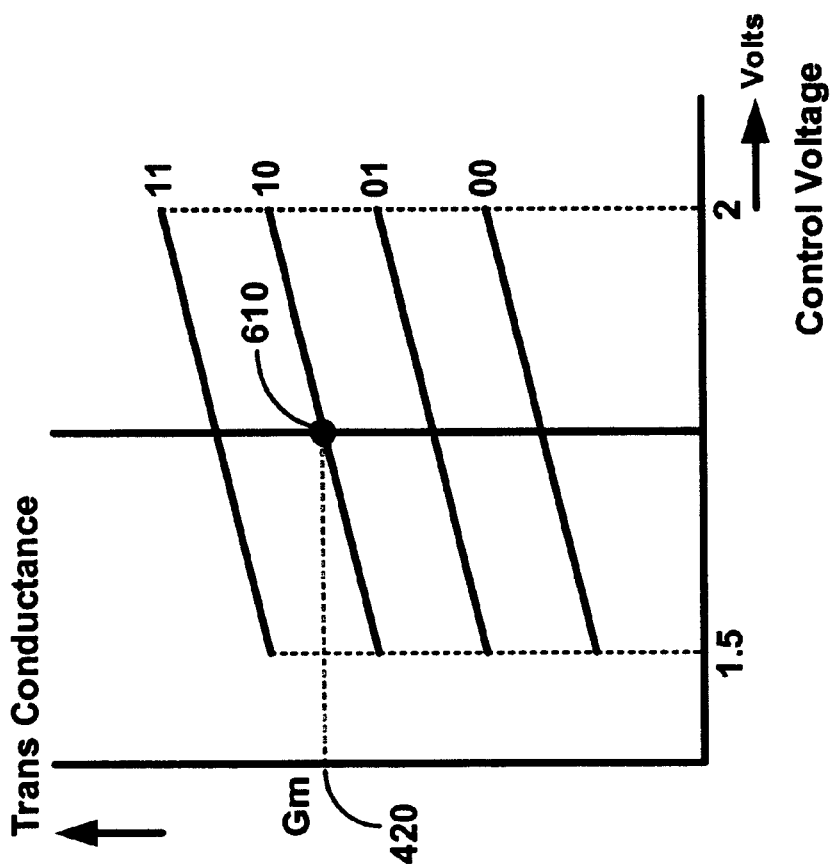
FIG. 6 depicts a graph illustrating the details of change in trans-conductance value for control voltage with four trans-conductor stages.

FIG. 6 is a graph illustrating the details of the range of available trans-conductance values of filter circuit 170 when two digital bits are used to select the trans-conductor stages. Four lines are shown corresponding to the four possible values 00, 01, 10, and 11 of the two bits. The position of each line (covering a range of trans-conductance values) generally depends on the trans-conductance values in the connected stages. As noted above, one or more trans-conductor stages can be connected to attain a corresponding range of trans-conductance values.

It may be observed that a desired trans-conductance value of 420 may be attained using either of the curves corresponding to bit values 10 (at point 610) and 01. Thus, the different lines/curves are selected according to the digital bits, and the control voltage may be used to obtain a specific point on the selected line. Mirror trans-conductor circuit 210 in digital tuning circuit 175 may also be implemented with similar multiple trans-conductor stages as in filter circuit 170.

The manner in which digital bits are generated in an embodiment of the present invention is described below with FIG. 7.

6. Digital Bits Generator

Figure 7:
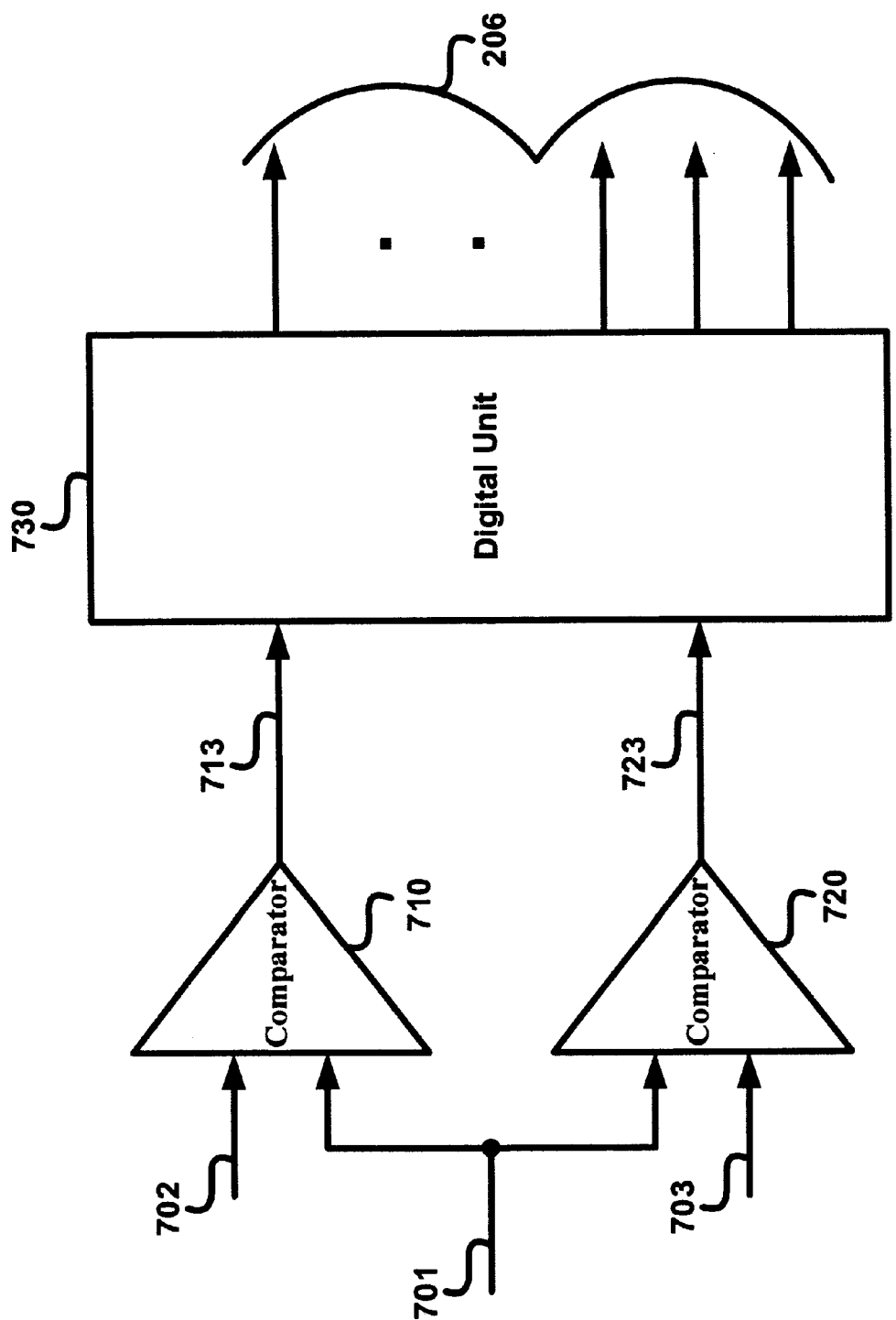
FIG. 7 is a block diagram illustrating the details of digital tuning range extension according to an aspect of the present invention.

FIG. 7 is a block diagram illustrating the manner in which digital bits generator 290 can be implemented in an embodiment of the present invention. The diagram is shown containing comparators 710 and 720, and digital unit 730. The diagram is shown receiving reference-up voltage 702 and reference-down voltage 703, in addition to control voltage 205. As may be appreciated from the description below, reference-up voltage 702 and reference-down voltage 703 define the boundaries at which additional trans-conductor stage may need to be activated or de-activated.

Comparator 710 receives the control voltage on path 701 and reference-up voltage on path 702. Comparator 710 compares the control voltage against the reference-up voltage and provides the below or above decision value on path 713. Similarly, comparator 720 receives the control voltage on path 701 and reference-down voltage on path 703. Comparator 720 compares the control voltage against the reference-down voltage and provides the decision value on path 723.

Digital unit 730 receives the decision values on paths 713 and 723 from comparators 710 and 720 respectively and accordingly generates digital bits on path 206. For example, if the control voltage on path 701 falls below the reference-down voltage, digital unit 730 decrements the value of digital bits on path 206, which may deactivate one/few of the trans-conductor stages and then control voltage increases.

On the other hand, if control voltage goes above reference-up voltage, digital unit 730 increments the value of digital bits on path 206, which may activate one/few of the trans-conductor stages and then control voltage decreases. Accordingly, the control voltage is adjusted to maintain the same trans-conductance value irrespective of any changes.

Thus, an embodiment of a digital bits generator provided according to the present invention extends the tuning range by activating/deactivating the trans-conductor stages with digital bits.

7. Conclusion

While various embodiments of the present invention have been described above, it should be understood that they have been presented by way of example only, and not limitation. Thus, the breadth and scope of the present invention should not be limited by any of the above described exemplary embodiments, but should be defined only in accordance with the following claims and their equivalents.

What is claimed is:

1. A tuning circuit for tuning a circuit for modifying a signal according to a transfer function, said tuning circuit comprising:

a trans-conductor circuit generating a charging current of a first polarity representing a trans-conductance of said trans-conductor circuit, wherein said trans-conductance circuit operates to provide a similar transfer function as said modifying circuit, a reference circuit generating a reference current of a second polarity representing a desired trans-conductance value;

an integrating capacitor receiving both said charging current and reference current so as to be charged to a voltage level representing a difference of said charging current and said reference current;

an amplifier having first and second inputs connected across the integrating capacitor, for amplifying said voltage level to generate a control signal, for controlling said present trans-conductance of said trans-conductor circuit and a trans-conductance of said modifying circuit; and a resistor, connected in parallel with the integrating capacitor, for limiting the voltage level at the first and second inputs of the amplifier to within the linear range of the amplifier.

2. The tuning circuit of claim 1, wherein said amplifier is the only active element in said tuning circuit.

3. The tuning circuit of claim 1, wherein said amplifier comprises an open loop amplifier.

4. The tuning circuit of claim 3, wherein said open loop amplifier comprises a single stage CMOS amplifier.

5. The tuning circuit of claim 1, further comprising: a first passive circuit coupled to the amplifier for reducing ripple in the control signal.

6. The tuning circuit of claim 1, wherein said modifying circuit comprises a filter circuit.

7. A tuning circuit for tuning a circuit for modifying a signal according to a transfer function, said tuning circuit comprising:

a trans-conductor circuit generating a present signal representing a present trans-conductance of said trans-conductor circuit, wherein said trans-conductance circuit operates to provide a similar transfer function as said modifying circuit, a reference circuit generating a reference signal representing a desired trans-conductance value;

an integrated capacitor receiving both said present signal and said reference signal in opposite directions, said integrating capacitor being charged to a voltage level representing a difference of said present signal and said reference signal;

an amplifier amplifying said voltage level to generate a control signal for controlling said present trans-conductance of said trans-conductor circuit and a trans-conductance of said modifying circuit, the amplifier having an inverting input terminal, a non-inverting input terminal and an output terminal; and a first passive circuit, coupled to the amplifier, for reducing ripple in the control signal, comprising:

a first resistor connected in parallel with said integrating capacitor; between a first node and a second node;

a second resistor connected between said non-inverting input terminal and said first node; and a third resistor connected between said inverting input terminal and said second node.

8. The tuning circuit of claim 7, wherein said first passive circuit further comprises:

a second capacitor connected between said output terminal of said amplifier and a ground;

a fifth resistor connected between said output terminal of said amplifier and a third node; and a third capacitor connected between said third node and said ground.

9. The tuning circuit of claim 8, further comprises a fourth resistor and a first capacitor connected in series between said output terminal and said ground.

10. A tuning circuit for tuning a circuit for modifying a signal according to a transfer function, said tuning circuit comprising:

a trans-conductor circuit comprising a plurality of trans-conductor stages, for generating a present signal representing a present trans-conductance of said trans-conductor circuit, wherein said trans-conductance circuit operates to provide a similar transfer function as said modifying circuit;

a reference circuit generating a reference signal representing a desired trans-conductance value;

an integrated capacitor receiving both said present signal and said reference signal in opposite directions, said integrating capacitor being charged to a voltage level representing a difference of said present signal and said reference signal;

an amplifier amplifying said voltage level to generate a control signal, for controlling said present trans-conductance of said trans-conductor circuit and a trans-conductance of said modifying circuit; and a digital bits generator receiving said control signal and generating a plurality of digital bits, each of said plurality of trans-conductor stages is activated or deactivated according to said plurality of bits.

11. The tuning circuit of claim 10, wherein said digital bits generator comprises:

a first comparator comparing a reference-up signal and said analog signal to generate a first result;

a second comparator comparing a reference-down signal and said analog signal to generate a second result; and a digital unit generating said plurality of digital bits according to said first result and said second result.

12. A tuning circuit for tuning a circuit for modifying a signal according to a transfer function, said tuning circuit comprising:

a trans-conductor circuit generating a present signal representing a present trans-conductance of said trans-conductor circuit, wherein said trans-conductance circuit operates to provide a similar transfer function as said modifying circuit;

a reference circuit, comprising a switched capacitor circuit, for generating a reference signal representing a desired trans-conductance value;

an integrated capacitor receiving both said present signal and said reference signal in opposite directions, said integrating capacitor being charged to a voltage level representing a difference of said present signal and said reference signal; and an amplifier amplifying said voltage level to generate a control signal, for controlling said present trans-conductance of said trans-conductor circuit and a trans-conductance of said modifying circuit.

13. A device comprising:

a circuit for modifying a signal according to a transfer function and a desired trans-conductance value, wherein the trans-conductance of said modifying circuit can deviate from said desired trans-conductance value in different operating conditions; and a tuning circuit for tuning said modifying circuit to said desired trans-conductance value, said tuning circuit comprising:

a trans-conductor circuit generating a charging current of a first polarity representing a trans-conductance of said trans-conductor circuit, wherein said trans-conductance circuit operates to provide a similar transfer function as said modifying circuit;

a reference circuit generating a reference current of a second polarity representing said desired trans-conductance value;

an integrating capacitor receiving both said charging current and reference current so as to be charged to a voltage level representing a difference of said charging current and said reference current;

an amplifier having first and second inputs connected across the integrating capacitor, for amplifying said voltage level to generate a control signal, for controlling said present trans-conductance of said trans-conductor circuit and a trans-conductance of said modifying circuit; and a resistor, connected in parallel with the integrating capacitor, for limiting the voltage level at the first and second inputs of the amplifier to within the linear range of the amplifier.

14. The device of claim 13, wherein said amplifier is the only active element in said tuning circuit.

15. The device of claim 13, wherein said amplifier comprises an open loop amplifier.

16. The device of claim 15, wherein said open loop amplifier comprises a single stage CMOS amplifier.

17. The device of claim 13, further comprising:
first passive circuit coupled to the amplifier for reducing ripple in the control signal.

18. The device of claim 13, wherein said modifying circuit comprises a filter circuit.

19. A device comprising:
a circuit for modifying a signal according to a transfer function and a desired trans-conductance value, wherein the trans-conductance of said modifying circuit can deviate from said desired trans-conductance value in different operating conditions; and
a tuning circuit for tuning said modifying circuit to said desired trans-conductance value, said tuning circuit comprising:
a trans-conductor circuit generating a present signal representing a present trans-conductance of said trans-conductor circuit, wherein said trans-conductance circuit operates to provide a similar transfer function as said modifying circuit;
a reference circuit generating a reference signal representing said desired trans-conductance value;
an integrating capacitor receiving both said present signal and said reference signal in opposite directions, said integrating capacitor being charged to a voltage level representing a difference of said present signal and said reference signal;
an amplifier, having an inverting input terminal, a non-inverting input terminal and an output terminal, for amplifying said voltage level to generate a control signal for controlling said present trans-conductance of said trans-conductor circuit and a trans-conductance of said modifying circuit; and
a first passive network, for reducing ripple in the control signal, comprising:
a first resistor connected in parallel with said integrating capacitor between a first node and a second node;
a second resistor connected between said non-inverting input terminal and said first node; and
a third resistor connected between said inverting input terminal and said second node.

20. The device of claim 19, wherein said first passive circuit further comprises:
a second capacitor connected between said output terminal of said amplifier and a ground;
a fifth resistor connected between said output terminal of said amplifier and a third node; and
a third capacitor connected between said third node and said ground.

21. The device of claim 20, further comprises a fourth resistor and a first capacitor connected in series between said output terminal and said ground.

22. A device comprising,
a circuit for modifying a signal according to a transfer function and a desired trans-conductance value, wherein the trans-conductance of said modifying circuit can deviate from said desired trans-conductance value in different operating conditions; and
a tuning circuit for tuning said modifying circuit to said desired trans-conductance value, said tuning circuit comprising:
a trans-conductor circuit, comprising a plurality of trans-conductor stages, for generating a present signal representing a present trans-conductance of said trans-conductor circuit, wherein said trans-conductance circuit operates to provide a similar transfer function as said modifying circuit;
a reference circuit generating a reference signal representing said desired trans-conductance value;
an integrating capacitor receiving both said present signal and said reference signal in opposite directions, said integrating capacitor being charged to a voltage level representing a difference of said present signal and said reference signal;
an amplifier amplifying said voltage level to generate a control signal, for controlling said present trans-conductance of said trans-conductor circuit and a trans-conductance of said modifying circuit; and
a digital bits generator receiving said control signal and generating a plurality of digital bits, wherein each of said plurality of trans-conductor stages is activated or deactivated according to said plurality of digital bits.

23. The device of claim 22, wherein said digital bits generator comprises:
a first comparator comparing a reference-up signal and said analog signal to generate a first result;
a second comparator comparing a reference-down signal and said analog signal to generate a second result; and
a digital unit generating said plurality of digital bits according to said first result and said second result.

24. A device comprising:
a circuit for modifying a signal according to a transfer function and a desired trans-conductance value, wherein the trans-conductance of said modifying circuit can deviate from said desired trans-conductance value in different operating conditions; and
a tuning circuit for tuning said modifying circuit to said desired trans-conductance value, said tuning circuit comprising:
a trans-conductor circuit generating a present signal representing a present trans-conductance of said trans-conductor circuit, wherein said trans-conductance circuit operates to provide a similar transfer function as said modifying circuit;
a reference circuit comprised of a switched capacitor circuit, for generating a reference signal representing said desired trans-conductance value;
an integrating capacitor receiving both said present signal and said reference signal in opposite directions, said integrating capacitor being charged to a voltage level representing a difference of said present signal and said reference signal; and
an amplifier amplifying said voltage level to generate a control signal, for controlling said present trans-conductance of said trans-conductor circuit and a trans-conductance of said modifying circuit.

* * * * *